United States Patent
Nishiguchi et al.

(10) Patent No.: US 10,612,160 B2
(45) Date of Patent: **\*Apr. 7, 2020**

(54) EPITAXIAL WAFER AND METHOD FOR MANUFACTURING SAME

(71) Applicant: Sumitomo Electric Industries, Ltd., Osaka-shi (JP)

(72) Inventors: Taro Nishiguchi, Itami (JP); Jun Genba, Itami (JP); Hironori Itoh, Itami (JP); Tomoaki Hatayama, Osaka (JP); Hideyuki Doi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,966

(22) Filed: Mar. 23, 2018

(65) Prior Publication Data
US 2018/0209064 A1  Jul. 26, 2018

Related U.S. Application Data

(63) Continuation of application No. 15/108,402, filed as application No. PCT/JP2015/070844 on Jul. 22, 2015, now Pat. No. 9,957,641.

(30) Foreign Application Priority Data

Aug. 1, 2014  (JP) .................................. 2014-157717

(51) Int. Cl.
*C30B 29/36* (2006.01)
*C30B 25/18* (2006.01)
(Continued)

(52) U.S. Cl.
CPC ............ *C30B 29/36* (2013.01); *C23C 16/325* (2013.01); *C30B 25/10* (2013.01); *C30B 25/186* (2013.01);
(Continued)

(58) Field of Classification Search
CPC ....... C30B 29/36; C30B 25/20; C23C 16/325; H01L 21/02378; H01L 21/02529
See application file for complete search history.

(56) References Cited

U.S. PATENT DOCUMENTS 5,363,800 A   11/1994  Larkin et al.
8,823,015 B2   9/2014  Momose et al.
(Continued)

FOREIGN PATENT DOCUMENTS

CN   1802752 A    7/2006
JP   2005-166930 A   6/2005
(Continued)

OTHER PUBLICATIONS

International Search Report in PCT International Application No. PCT/JP2015/070844, dated Oct. 6, 2015.
(Continued)

*Primary Examiner* — Laura A Auer
(74) *Attorney, Agent, or Firm* — Baker Botts L.L.P.; Michael A. Sartori

(57) ABSTRACT

An epitaxial wafer includes a silicon carbide film having a first main surface. A groove portion is formed in the first main surface. The groove portion extends in one direction along the first main surface. Moreover, a width of the groove portion in the one direction is twice or more as large as a width of the groove portion in a direction perpendicular to the one direction. Moreover, a maximum depth of the groove portion from the first main surface is not more than 10 nm.

5 Claims, 6 Drawing Sheets

(51) Int. Cl.
*H01L 21/02* (2006.01)
*C23C 16/32* (2006.01)
*C30B 25/10* (2006.01)
*C30B 25/20* (2006.01)

(52) U.S. Cl.
CPC .......... *C30B 25/20* (2013.01); *H01L 21/0262* (2013.01); *H01L 21/02378* (2013.01); *H01L 21/02433* (2013.01); *H01L 21/02529* (2013.01); *H01L 21/02576* (2013.01)

(56) References Cited

U.S. PATENT DOCUMENTS

| | | |
|---|---|---|
| 9,263,527 B2 | 2/2016 | Yamada et al. |
| 9,728,628 B2 | 8/2017 | Wada et al. |
| 2006/0220026 A1 | 10/2006 | Uchida et al. |
| 2007/0108450 A1 | 5/2007 | O'Loughlin et al. |
| 2009/0278169 A1 | 11/2009 | Hayashi et al. |
| 2010/0314626 A1 | 12/2010 | Harada et al. |
| 2011/0006310 A1 | 1/2011 | Nagasawa et al. |
| 2012/0049161 A1 | 3/2012 | Dimitrakopoulos et al. |
| 2012/0175635 A1 | 7/2012 | Weis et al. |
| 2012/0280254 A1 | 11/2012 | Muto et al. |
| 2013/0029158 A1 | 1/2013 | Aigo et al. |
| 2013/0062620 A1 | 3/2013 | Henning et al. |
| 2013/0069710 A1 | 3/2013 | Hirler et al. |
| 2013/0161619 A1 | 6/2013 | Wada et al. |
| 2013/0248981 A1 | 9/2013 | Okumura et al. |
| 2014/0054609 A1 | 2/2014 | Burk et al. |
| 2014/0117381 A1 | 5/2014 | Kang et al. |
| 2014/0197422 A1 | 7/2014 | Wada et al. |
| 2014/0209927 A1 | 7/2014 | Nishio et al. |
| 2014/0295136 A1 | 10/2014 | Ohno et al. |
| 2015/0001553 A1 | 1/2015 | Kudou et al. |
| 2015/0214353 A1 | 7/2015 | Yamada et al. |
| 2015/0279926 A1 | 10/2015 | Hiyoshi et al. |
| 2015/0287817 A1 | 10/2015 | Kubota et al. |
| 2016/0197155 A1 | 7/2016 | Hiyoshi |
| 2016/0225855 A1 | 8/2016 | Hiyoshi et al. |
| 2016/0268381 A1 | 9/2016 | Ota et al. |
| 2016/0326668 A1 | 11/2016 | Nishiguchi et al. |
| 2016/0351667 A1 | 12/2016 | Wada et al. |
| 2016/0355949 A1 | 12/2016 | Wada et al. |

FOREIGN PATENT DOCUMENTS

| | | |
|---|---|---|
| JP | 2005-183943 A | 7/2005 |
| JP | 2007-525402 A | 9/2007 |
| JP | 2008-159740 A | 7/2008 |
| JP | 2008-205296 A | 9/2008 |
| JP | 2009-218575 A | 9/2009 |
| JP | 2009-256138 A | 11/2009 |
| JP | 2013-034007 A | 2/2013 |
| JP | 2014-017439 A | 1/2014 |
| JP | 2014-093526 A | 5/2014 |
| JP | 5577478 B1 | 8/2014 |
| WO | 2005/093137 A1 | 10/2005 |
| WO | 2011/074453 A1 | 6/2011 |

OTHER PUBLICATIONS

International Search Report in International Application No. PCT/JP2015/070845, dated Oct. 20, 2015.
U.S. Appl. No. 15/114,009, filed Jul. 25, 2016.
Non-Final Office Action issued in U.S. Appl. No. 15/114,009, dated Dec. 21, 2016.
Notice of Allowance issued in U.S. Appl. No. 15/114,009, dated May 5, 2017.
Zhang et al., "Cross-sectional structure of carrot defects in 4H-SiC epilayers," Applied Physics Letters, vol. 85, No. 22, Nov. 29, 2004.

EPITAXIAL WAFER AND METHOD FOR MANUFACTURING SAME

CROSS-REFERENCE TO RELATED APPLICATIONS

This application is a Continuation of U.S. patent application Ser. No. 15/108,402, filed Jun. 27, 2016, which is a 371 application of International Application No. PCT/JP2015/070844, filed Jul. 22, 2015, which claims the benefit of Japanese Patent Application No. 2014-157717, filed Aug. 1, 2014.

TECHNICAL FIELD

The present disclosure relates to an epitaxial wafer and a method for manufacturing the epitaxial wafer.

BACKGROUND ART

Japanese Patent Laying-Open No. 2014-17439 (Patent Document 1) discloses a semiconductor manufacturing device used to manufacture an epitaxial wafer.

CITATION LIST

Patent Document

PTD 1: Japanese Patent Laying-Open No. 2014-17439

SUMMARY OF INVENTION

An epitaxial wafer according to the present disclosure includes a silicon carbide film having a first main surface. A groove portion is formed in the first main surface of the silicon carbide film. The groove portion extends in one direction along the first main surface. Moreover, a width of the groove portion in the one direction is twice or more as large as a width of the groove portion in a direction perpendicular to the one direction. Moreover, a maximum depth of the groove portion from the first main surface is not more than 10 nm.

A method for manufacturing an epitaxial wafer according to the present disclosure includes the steps of: preparing a silicon carbide substrate having a second main surface; and epitaxially growing a silicon carbide film on the second main surface. The step of epitaxially growing the silicon carbide film includes the steps of: epitaxially growing a first film on the second main surface using a source material gas having a C/Si ratio of less than 1; reconstructing a surface of the first film using a mixed gas including (i) a source material gas having a C/Si ratio of less than 1 and (ii) a hydrogen gas; and epitaxially growing a second film on the reconstructed surface of the first film using a source material gas having a C/Si ratio of not less than 1.

DESCRIPTION OF EMBODIMENTS

Description of Embodiments of Present Disclosure

Figure 1:
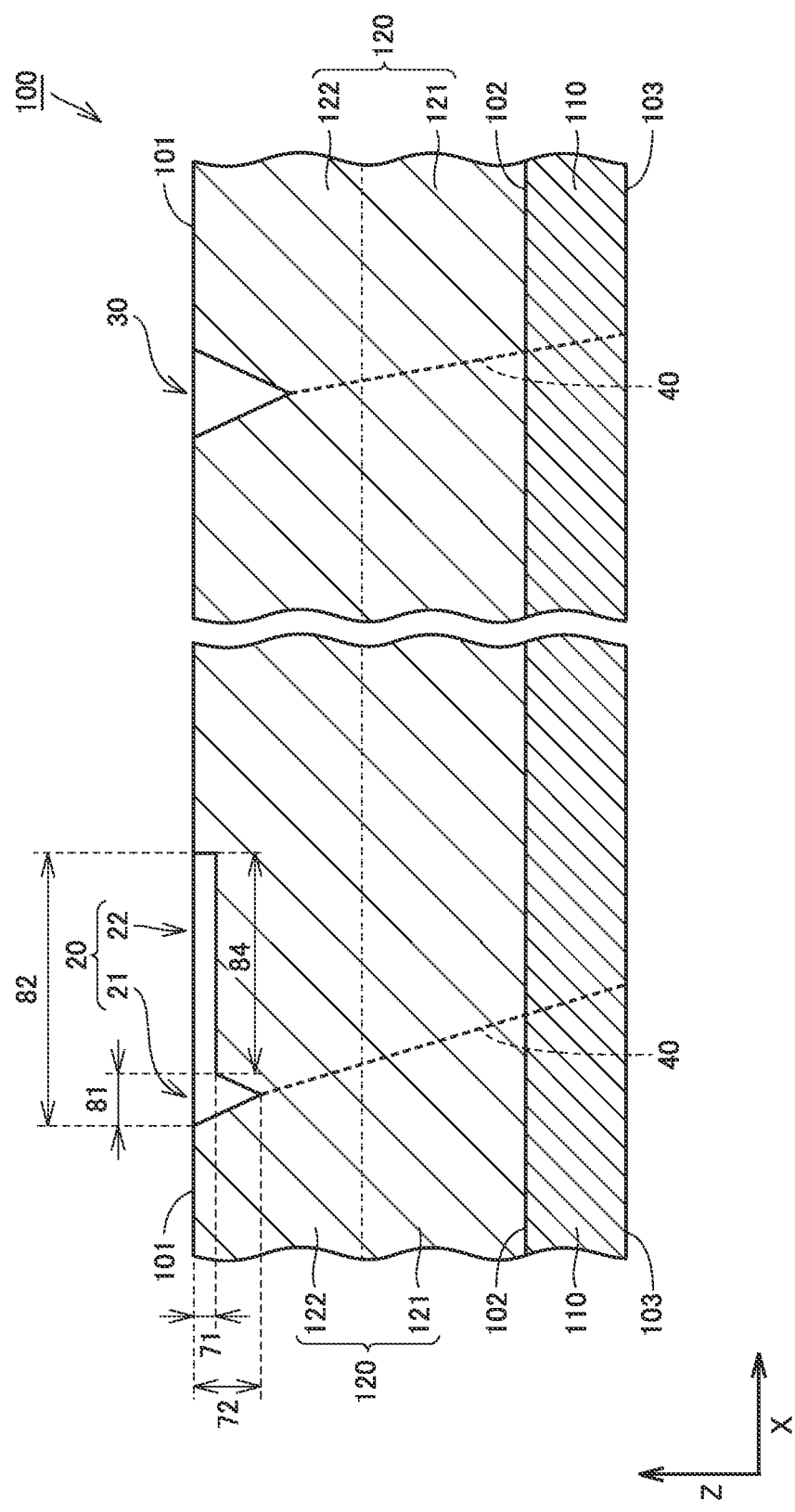
FIG. 1 is a schematic cross sectional view showing a portion of an epitaxial wafer of the present disclosure.

First, embodiments of the present disclosure are listed and described.

[1] An epitaxial wafer 100 according to the present disclosure includes a silicon carbide film 120 having a first main surface 101. A groove portion 20 is formed in first main surface 101, groove portion 20 extending in one direction along first main surface 101, a width of groove portion 20 in the one direction being twice or more as large as a width of groove portion 20 in a direction perpendicular to the one direction, a maximum depth of groove portion 20 from first main surface 101 being not more than 10 nm.

Hereinafter, the width of groove portion 20 in the one direction will be referred to as "second width 82", the width of groove portion 20 in the direction perpendicular to the one direction will be referred to as "third width 83", and the maximum depth of groove portion 20 from first main surface 101 will be referred to as "second depth 72".

When epitaxially growing a silicon carbide film on a silicon carbide substrate, minute pit portions may be formed in a surface of the silicon carbide film. Each of such pit portions is formed due to a threading dislocation transferred from the silicon carbide substrate to the silicon carbide film, and is a depression having a depth of about several ten nm. The present inventor has found that these pit portions cause increase of variation in film thickness of an oxide film formed on the surface of the silicon carbide film and the variation in film thickness is one factor for decrease of long-term reliability of a silicon carbide semiconductor device.

The present inventor has found that the formation of pit portions can be suppressed under a specific epitaxial growth condition. According to the growth condition, the pit portions are reduced whereas a multiplicity of groove portions are formed which are shallower than the pit portions and which extend in one direction. However, these groove portions are shallower than the pit portions and therefore have a smaller influence over the film thickness of the oxide film than the influence of the pit portions.

In epitaxial wafer 100 described above, groove portion 20 is formed in first main surface 101 of silicon carbide film 120 to extend in one direction such that a ratio of second width 82 to third width 83 is not less than 2 and to have second depth 72 of not more than 10 nm. That is, by controlling the conditions for epitaxial growth of silicon carbide film 120 and the like, epitaxial wafer 100 is provided with a larger number of groove portions 20 than the above-described pit portions each having a depth of several ten nm. Hence, according to epitaxial wafer 100, variation in film thickness of the oxide film can be reduced as compared with the conventional epitaxial wafer in which the multiplicity of pit portions are formed.

The shape of the "groove portion" can be specified by observing first main surface 101 using a predetermined defect inspection device. Accordingly, second width 82 and third width 83 of groove portion 20 can be measured. As the defect inspection device, WASAVI series "SICA 6×" provided by Lasertec Corporation (objective lens: ×10) can be used, for example. Moreover, the depth of the "groove portion" can be measured using an AFM (Atomic Force Microscope).

[2] In epitaxial wafer 100 described above, groove portion 20 may include a first groove portion 21 and a second groove portion 22 connected to first groove portion 21. First groove portion 21 may be formed in one end portion of groove portion 20 in the one direction. Second groove portion 22 may extend in the one direction from first groove portion 21 to the other end portion opposite to the one end portion, and first depth 71, which is a depth of second groove portion 22 from first main surface 101, may be smaller than second depth 72, which is the maximum depth of first groove portion 21.

In epitaxial wafer 100 in which groove portion 20 having the above structure is formed, the formation of pit portions that would have otherwise caused increase of variation in film thickness of the oxide film is suppressed. Accordingly, according to epitaxial wafer 100, variation in film thickness of the oxide film can be reduced.

[3] Epitaxial wafer 100 may further include a silicon carbide substrate 110 having a second main surface 102 having an off angle of not more than ±4° relative to a (0001) plane. Silicon carbide film 120 may be a silicon carbide single crystal film formed on second main surface 102, and groove portion 20 may be formed to extend from a threading dislocation 40 in silicon carbide film 120 in a step-flow growth direction that is along an off direction of the off angle.

As described above, groove portion 20 may be formed to extend in the step-flow growth direction. In epitaxial wafer 100 in which such a groove portion 20 is formed, the formation of minute pits that would have otherwise caused decrease of long-term reliability of the silicon carbide semiconductor device is suppressed. Accordingly, according to epitaxial wafer 100, variation in film thickness of the oxide film can be reduced.

[4] In epitaxial wafer 100, the off direction may be in a range of not more than ±5° relative to a <11-20> direction. Thus, second main surface 102 may be inclined relative to a (0001) plane in the predetermined off direction.

[5] In epitaxial wafer 100, the off direction may be in a range of not more than ±5° relative to a <01-10> direction. Thus, second main surface 102 may be inclined relative to the (0001) plane in the predetermined off direction.

[6] A method for manufacturing an epitaxial wafer according to the present disclosure includes the steps of: preparing (S10) a silicon carbide substrate 110 having a second main surface 102; and epitaxially growing (S20) a silicon carbide film on the second main surface. The step of epitaxially growing the silicon carbide film includes the steps of: epitaxially growing a first film 121 on second main surface 102 using a source material gas having a C/Si ratio of less than 1; reconstructing a surface of first film 121 using a mixed gas including (i) a source material gas having a C/Si ratio of less than 1 and (ii) a hydrogen gas; and epitaxially growing a second film 122 on the reconstructed surface of first film 121 using a source material gas having a C/Si ratio of not less than 1.

In [6] described above, the "C/Si ratio" represents a ratio of the number of carbon (C) atoms to the number of silicon (Si) atoms in the source material gas. The expression "reconstructing the surface" indicates to change a surface property of the first film through etching by the hydrogen gas and through epitaxial growth by the source material gas. Through the step of reconstructing, the thickness of the first film may be decreased, may be increased, or may be substantially unchanged.

In the step of reconstructing the surface, the ratio of the flow rate of the source material gas to the flow rate of the hydrogen gas may be reduced as compared with general epitaxial growth such that the etching by the hydrogen gas is comparable to the epitaxial growth by the source material gas. For example, it is considered to adjust the flow rate of the hydrogen gas and the flow rate of the source material gas to attain a film formation rate of about 0±0.5 μm/h.

The above-described threading dislocations include threading screw dislocations, threading edge dislocations, and composite dislocations in which these dislocations are mixed. These dislocations are expressed by Burgers vector b in the following manner: threading screw dislocations (b=<0001>); threading edge dislocations (b=⅓<11-20>); and composite dislocations (b=<0001>+⅓<11-20>). It is considered that the pit portions having an influence over variation in film thickness of the oxide film are formed due to the threading screw dislocations, the threading edge dislocations, and the composite dislocations. Pit portions formed due to the threading screw dislocations and composite dislocations both involving relatively large strain around the dislocations have deep depths.

In [6] described above, the surface of the first film is reconstructed, whereby it can be expected to obtain an effect of attaining shallow pit portions formed due to threading screw dislocations and composite dislocations. In addition to this, the C/Si ratio of the source material gas is changed from a value of less than 1 to a value of not less than 1 and the second film is then grown. Accordingly, it is considered to increase the effect of attaining shallow pit portions resulting from threading screw dislocations and composite dislocations.

Details of Embodiments of Present Disclosure

Next, with reference to figures, a specific example of one embodiment (hereinafter, referred to as "the present embodiment") of the present disclosure will be described. It should be noted that in the below-described figures, the same or corresponding portions are given the same reference characters and are not described repeatedly. Further, in the present specification, an individual orientation is represented by [ ], a group orientation is represented by < >, and an individual plane is represented by ( ), and a group plane is represented by { }. In addition, a negative index is supposed to be crystallographically indicated by putting "–" (bar) above a numeral, but is indicated by putting the negative sign before the numeral in the present specification.

<Structure of Epitaxial Wafer>

Figure 2:
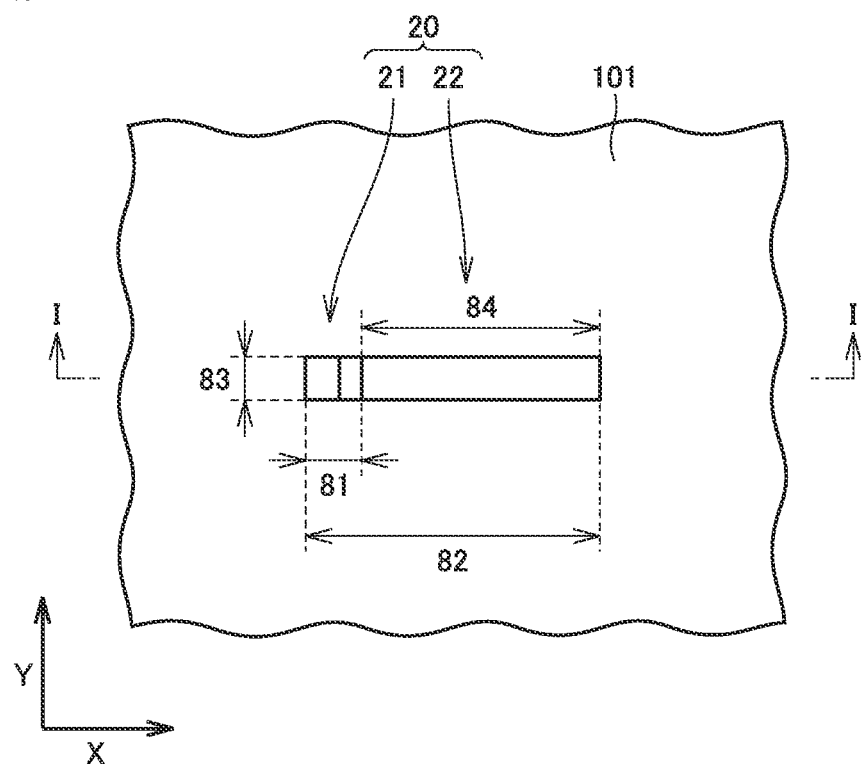
FIG. 2 is a schematic plan view showing a portion of the epitaxial wafer of the present disclosure.
Figure 3:
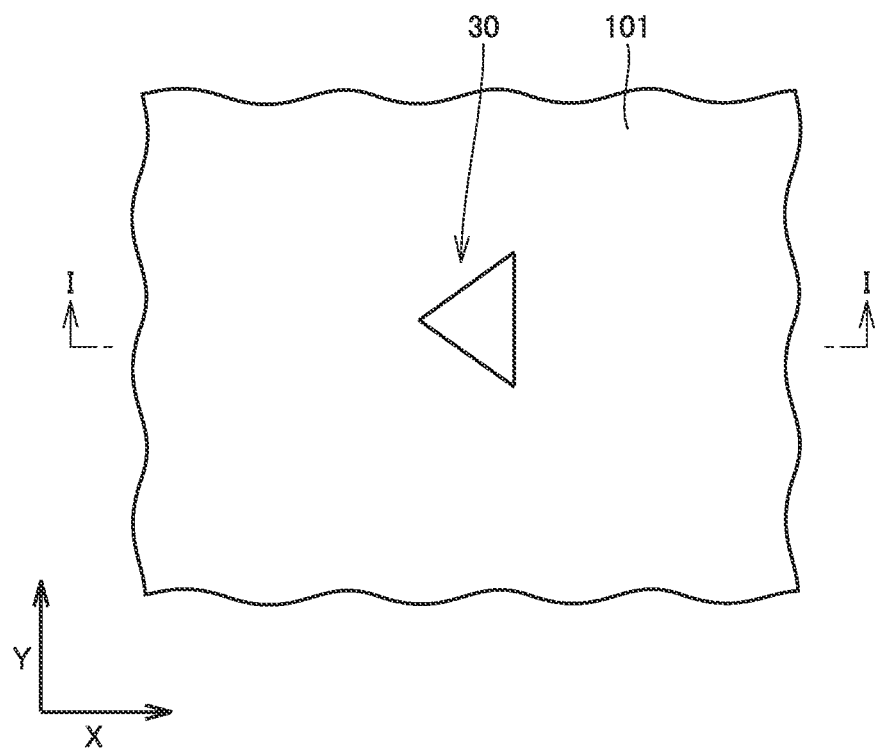
FIG. 3 is a schematic plan view showing a portion of the epitaxial wafer of the present disclosure.

First, the following describes a configuration of an epitaxial wafer according to the present embodiment with reference to FIG. 1 to FIG. 3. FIG. 1 partially shows a cross sectional structure of the epitaxial wafer according to the present embodiment. Each of FIG. 2 and FIG. 3 partially shows a planar structure of the epitaxial wafer according to the present embodiment. FIG. 1 shows a cross sectional structure along a line segment I-I shown in FIG. 2 and FIG. 3.

As shown in FIG. 1, epitaxial wafer 100 according to the present embodiment has a silicon carbide substrate 110 and a silicon carbide film 120. Silicon carbide substrate 110 is composed of a silicon carbide single crystal, for example. This silicon carbide single crystal has a hexagonal crystal structure and has a polytype of 4H, for example. Silicon carbide substrate 110 includes an n type impurity such as nitrogen (N) and therefore has n type conductivity. Silicon carbide substrate 110 has a diameter of not less than 100 mm (not less than 4 inches), preferably, not less than 150 mm (not less than 6 inches), for example.

Silicon carbide substrate 110 has a second main surface 102 and a third main surface 103 opposite to second main surface 102. As shown in FIG. 1, second main surface 102 is a main surface on which silicon carbide film 120 is formed. Second main surface 102 has an off angle of not more than ±4° relative to a (0001) plane (hereinafter, referred to as "silicon (Si) plane"). The off direction of this off angle may be in a range of not more than ±5° relative to a <11-20> direction or may be in a range of not more than ±5° relative to a <01-10> direction, for example.

Silicon carbide film 120 is a silicon carbide single crystal film formed on second main surface 102 by vapor phase epitaxy such as CVD. More specifically, silicon carbide film 120 is an epitaxial growth layer formed by CVD employing silane ($SiH_4$) and propane ($C_3H_8$) as a source material gas and nitrogen ($N_2$) or ammonia ($NH_3$) as a dopant gas. Moreover, silicon carbide film 120 includes nitrogen (N) atoms, which are generated through thermal decomposition of the nitrogen or ammonia, and therefore has n type conductivity type. The n type impurity concentration of silicon carbide film 120 is lower than the n type impurity concentration of silicon carbide substrate 110. It should be noted that since second main surface 102 is angled off relative to the (0001) plane as described above, silicon carbide film 120 is formed through step-flow growth. Hence, silicon carbide film 120 is composed of 4H type silicon carbide as with silicon carbide substrate 110 and therefore a different type of polytype is suppressed from being mixed therein. Silicon carbide film 120 has a thickness of about not less than 10 μm and not more than 50 μm, for example.

A groove portion 20 is formed in a surface of silicon carbide film 120, i.e., a first main surface 101. As shown in FIG. 2, groove portion 20 extends in one direction along first main surface 101 in a plan view of first main surface 101. More specifically, groove portion 20 extends in a step-flow growth direction, which is along the off direction of the off angle of first main surface 101 relative to the (0001) plane. In other words, groove portion 20 extends in a direction in a range of not more than ±5° relative to the <11-20> direction or a direction in a range of not more than ±5° relative to the <01-10> direction.

It should be noted that FIG. 1 to FIG. 3 are drawn such that the "step-flow growth direction" corresponds to the X-axis direction in FIG. 1 to FIG. 3. In each of FIG. 1 to FIG. 3, the X-axis direction, Y-axis direction, and Z-axis direction are orthogonal to one another. The Y-axis direction shown in each of FIG. 2 and FIG. 3 represents a direction perpendicular to the step-flow growth direction. The Z-axis direction shown in FIG. 1 represents the thickness direction of the silicon carbide film.

The width (second width 82) of groove portion 20 in the above-described one direction is twice or more as large as, preferably, five times or more as large as the width (third width 83) thereof in the direction perpendicular to the one direction. Second width 82 is not less than 15 μm and not more than 50 μm, preferably, not less than 25 μm and not more than 35 μm. Moreover, third width 83 is not less than 1 μm and not more than 5 μm, preferably, not less than 2 μm and not more than 3 μm.

As shown in FIG. 1, groove portion 20 is formed to extend in the step-flow growth direction from a threading dislocation 40 included in silicon carbide film 120. More specifically, groove portion 20 includes: a first groove portion 21 formed on threading dislocation 40; and a second groove portion 22 formed to be connected to first groove portion 21 and extend from first groove portion 21 in the step-flow growth direction.

First groove portion 21 is formed at one end portion (left end portion in FIG. 1) of groove portion 20 in the step-flow growth direction. Moreover, the maximum depth (second depth) of first groove portion 21 from first main surface 101 is not more than 10 nm. Second depth 72 is the maximum depth in the entire groove portion 20 as shown in FIG. 1. Moreover, first groove portion 21 preferably has a width (first width 81) of not more than 1 μm, and more preferably has a width (first width 81) of not more than 0.5 μm.

As shown in FIG. 1, second groove portion 22 is formed to extend from its portion of connection with first groove portion 21 to the other end portion opposite to the above-described one end portion (right end portion in FIG. 1). Moreover, second groove portion 22 is formed such that a depth (first depth 71) of second groove portion 22 from first main surface 101 is smaller than the maximum depth (second depth 72) of first groove portion 21. More specifically, second groove portion 22 extends in the step-flow growth direction while maintaining the depth shallower than second depth 72. First depth 71 is preferably not more than 3 nm, is more preferably not more than 2 nm, and is further preferably not more than 1 nm. Moreover, second groove portion 22 has a width (fourth width 84) of, for example, not less than 20 μm, preferably, not less than 25 μm.

<Method for Manufacturing Epitaxial Wafer>

Figure 4:
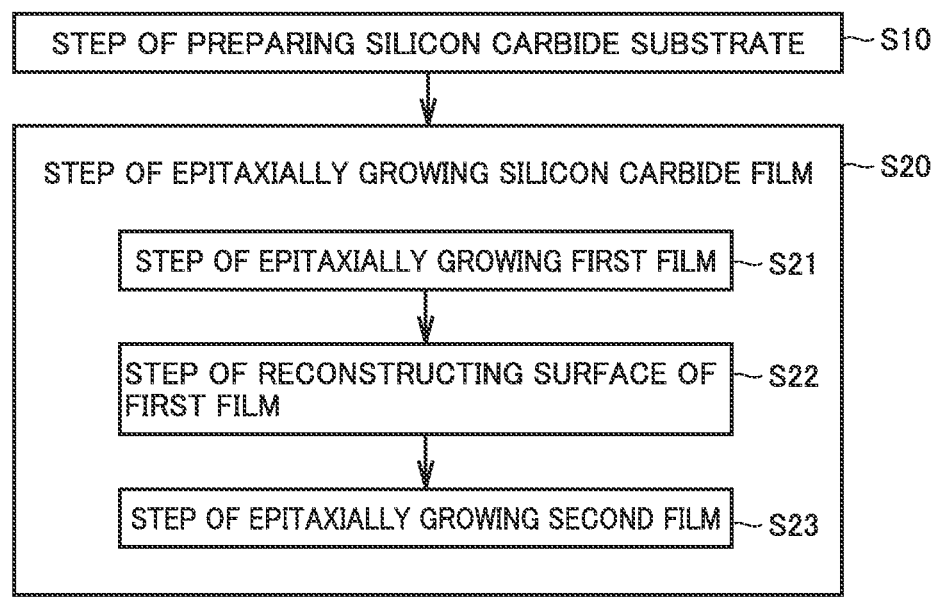
FIG. 4 is a flowchart schematically showing a method for manufacturing the epitaxial wafer of the present disclosure.

Next, the following describes a method for manufacturing the epitaxial wafer according to the present embodiment. As shown in FIG. 4, the manufacturing method includes: a step (S10) of preparing a silicon carbide substrate; and a step (S20) of epitaxially growing a silicon carbide film.

First, as the step (S10), a step of preparing the silicon carbide substrate is performed. In this step (S10), a 4H type silicon carbide ingot (not shown) obtained through crystal growth using, for example, a sublimation-recrystallization method is sliced into a predetermined thickness, thereby preparing silicon carbide substrate 110 (FIG. 1) having second main surface 102 and third main surface 103.

Figure 5:
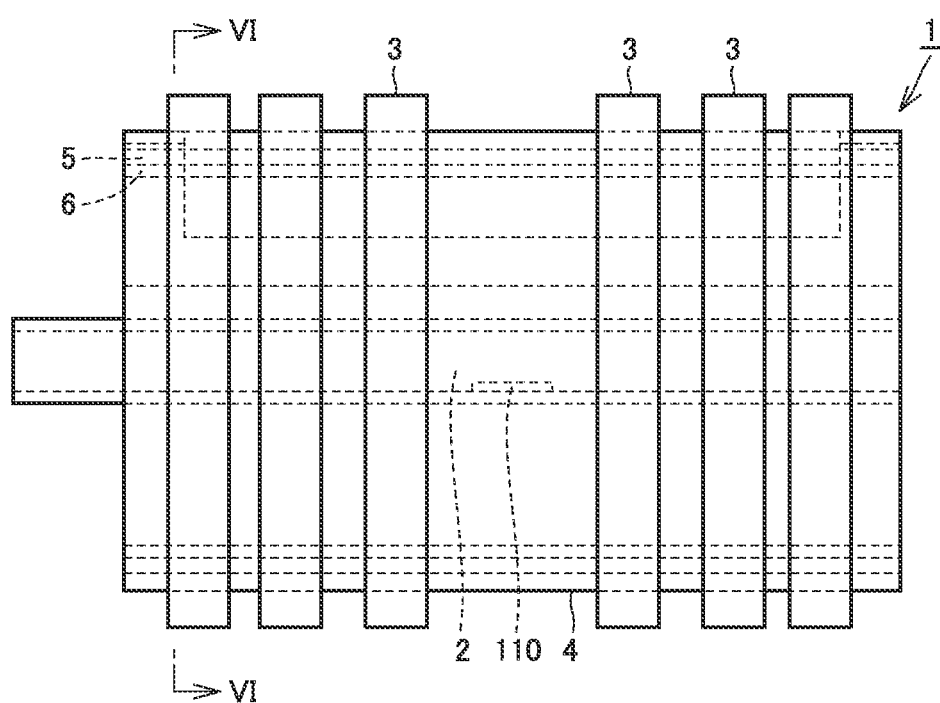
FIG. 5 is a schematic view showing a configuration of an epitaxial growth device.
Figure 6:
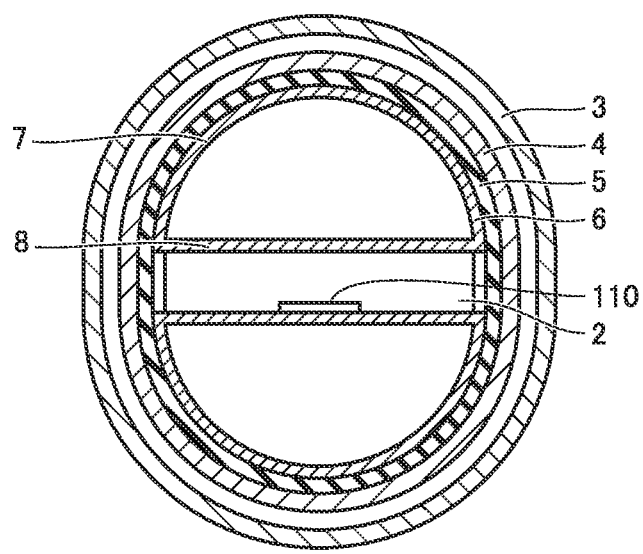
FIG. 6 is a schematic view showing a cross section taken along a line segment VI-VI in FIG. 5.

Next, as the step (S20), a step of growing the silicon carbide film is performed. In this step (S20), as shown in FIG. 1, silicon carbide film 120 is epitaxially grown using CVD on second main surface 102 of silicon carbide substrate 110. First, the following describes a configuration of an epitaxial growth device 1 used in this step (S20). FIG. 5 is a side view of epitaxial growth device 1. FIG. 6 is a cross sectional view of epitaxial growth device 1 along a line segment VI-VI in FIG. 5.

As shown in FIG. 5 and FIG. 6, epitaxial growth device 1 mainly includes heating elements 6, a heat insulator 5, a quartz tube 4, and an induction heating coil 3. Each of heating elements 6 is composed of a carbon material, for example. As shown in FIG. 6, heating element 6 has a semi-cylindrical hollow structure including a curved portion 7 and a flat portion 8. Two heating elements 6 are provided and disposed such that their respective flat portions 8 face each other. A space surrounded by these flat portions 8 is a channel 2 serving as a space for performing a treatment to silicon carbide substrate 110.

Heat insulator 5 is a member configured to thermally insulate channel 2 from the outside of epitaxial growth device 1. Heat insulator 5 is provided to surround the outer circumference portions of heating elements 6. Quartz tube 4 is provided to surround the outer circumference portion of heat insulator 5. Induction heating coil 3 is wound at the outer circumference portion of quartz tube 4.

Next, the following describes a crystal growth process employing epitaxial growth device 1 described above. First, silicon carbide substrate 110 prepared in the step (S10) is placed in channel 2 of epitaxial growth device 1. More specifically, silicon carbide substrate 110 is placed on a susceptor (not shown) provided on one heating element 6.

1. Step (S21) of Epitaxially Growing First Film

Next, a step of epitaxially growing a first film is performed. In this step, a source material gas having a C/Si ratio of less than 1 is used to epitaxially grow a first film 121 (see FIG. 1) on second main surface 102 of silicon carbide substrate 110. First, after gas replacement in channel 2, a pressure in channel 2 is adjusted to a predetermined pressure such as 60 mbar to 100 mbar (6 kPa to 10 kPa) while letting a carrier gas to flow. The carrier gas may be, for example, hydrogen ($H_2$) gas, argon (Ar) gas, helium (He) gas, or the like. The flow rate of the carrier gas may be about 50 slm to 200 slm, for example. The unit for flow rate as used herein, i.e., "slm (Standard Liter per Minute)" represents "L/min" in a standard condition (0° C. and 101.3 kPa).

Next, a predetermined alternating current is supplied to the induction heating coil, thereby inductively heating heating elements 6. Accordingly, channel 2 and the susceptor having silicon carbide substrate 110 placed thereon are heated to a predetermined reaction temperature. On this occasion, the susceptor is heated to about 1500° C. to 1750° C., for example.

Next, a source material gas is supplied. The source material gas includes a Si source gas and a C source gas. Examples of the Si source gas includes silane ($SiH_4$) gas, disilane ($Si_2H_6$) gas, dichlorosilane ($SiH_2Cl_2$) gas, trichlorosilane ($SiHCl_3$) gas, silicon tetrachloride ($SiCl_4$) gas, and the like. That is, the Si source gas may be at least one selected from a group consisting of silane gas, disilane gas, dichlorosilane gas, trichlorosilane gas and silicon tetrachloride gas.

Examples of the C source gas includes methane ($CH_4$) gas, ethane ($C_2H_6$) gas, propane ($C_3H_8$) gas, acetylene ($C_2H_2$) gas, and the like. That is, the C source gas may be at least one selected from a group consisting of methane gas, ethane gas, propane gas, and acetylene gas.

The source material gas may include a dopant gas. Examples of the dopant gas include nitrogen gas, ammonia gas, and the like.

The source material gas in the step of epitaxially growing the first film may be a mixed gas of silane gas and propane gas, for example. In the step of epitaxially growing the first film, the C/Si ratio of the source material gas is adjusted to less than 1. For example, the C/Si ratio may be not less than 0.5, not less than 0.6, or not less than 0.7 as long as the C/Si ratio is less than 1. Moreover, for example, the C/Si ratio may be not more than 0.95, not more than 0.9, or not more than 0.8. The flow rate of the silane gas and the flow rate of the propane gas may be adjusted appropriately in a range of about 10 to 100 sccm to achieve a desired C/Si ratio, for example. The unit for flow rate as used herein, i.e., "sccm (Standard Cubic Centimeter per Minute)" represents "mL/min" in a standard condition (0° C. and 101.3 kPa).

A film formation rate in the step of epitaxially growing the first film may be about not less than 3 μm/h and not more than 30 μm/h, for example. The first film has a thickness of not less than 0.1 μm and not more than 150 μm, for example. The thickness of the first film may be not less than 0.2 μm, may be not less than 1 μm, may be not less than 10 μm, or may be not less than 15 μm. Moreover, the thickness of the first film may be not more than 100 μm, may be not more than 75 μm, or may be not more than 50 μm.

2. Step (S22) of Reconstructing Surface of First Film

Next, a step of reconstructing a surface of the first film is performed. The step of reconstructing the surface may be performed continuous to the step of epitaxially growing the first film. Alternatively, a predetermined halt time may be provided between the step of epitaxially growing the first film and the step of reconstructing the surface. In the step of reconstructing the surface, the temperature of the susceptor may be increased by about 10° C. to 30° C.

In the step of reconstructing the surface, a mixed gas including a source material gas having a C/Si ratio of less than 1 and hydrogen gas is used. The C/Si ratio of the source material gas may be lower than the C/Si ratio in the step of epitaxially growing the first film. The C/Si ratio may be not less than 0.5, not less than 0.6, or not less than 0.7 as long as the C/Si ratio is less than 1. Moreover, for example, the C/Si ratio may be not more than 0.95, not more than 0.9, or not more than 0.8.

In the step of reconstructing the surface, there may be used a source material gas different from the source material gas used in each of the step of epitaxially growing the first film and a below-described step of epitaxially growing a second film. In this way, it is expected to increase an effect of attaining a shallow pit portion. For example, it is considered to configure such that in each of the step of epitaxially growing the first film and the below-described step of epitaxially growing the second film, silane gas and propane gas are used, whereas in the step of reconstructing the surface, dichlorosilane and acetylene are used.

In the step of reconstructing the surface, the ratio of the flow rate of the source material gas to the flow rate of the hydrogen gas may be decreased as compared with those in the step of epitaxially growing the first film and the below-described step of epitaxially growing the second film. Accordingly, it is expected to increase the effect of attaining a shallow pit portion.

The flow rate of the hydrogen gas in the mixed gas is about not less than 100 slm and not more than 150 slm, for example. The flow rate of the hydrogen gas may be about 120 slm, for example. The flow rate of the Si source gas in the mixed gas may be not less than 1 sccm and not more than 5 sccm, for example. The lower limit of the flow rate of the Si source gas may be 2 sccm. The upper limit of the flow rate of the Si source gas may be 4 sccm. The flow rate of the C source gas in the mixed gas may be not less than 0.3 sccm and not more than 1.6 sccm, for example. The lower limit of the flow rate of the C source gas may be 0.5 sccm or 0.7 sccm. The upper limit of the C source gas may be 1.4 sccm or 1.2 sccm.

In the step of reconstructing the surface, it is desirable to adjust various conditions such that etching by the hydrogen gas is comparable to epitaxial growth by the source material gas. For example, it is considered to adjust the flow rate of the hydrogen gas and the flow rate of the source material gas to attain a film formation rate of about 0±0.5 μm/h. The film formation rate may be adjusted to about 0±0.4 μm/h, may be adjusted to about 0±0.3 μm/h, may be adjusted to about 0±0.2 μm/h, or may be adjusted to about 0±0.1 μm/h. Accordingly, it is expected to increase the effect of attaining a shallow pit portion.

A treatment time in the step of reconstructing the surface is about not less than 30 minutes and not more than 10 hours, for example. The treatment time may be not more than 8 hours, may be not more than 6 hours, may be not more than 4 hours, or may be not more than 2 hours.

3. Step (S23) of Epitaxially Growing Second Film

After reconstructing the surface of the first film, the step of epitaxially growing the second film on this surface is performed. Second film 122 (see FIG. 1) is formed using a source material gas having a C/Si ratio of not less than 1. For example, the C/Si ratio may be not less than 1.05, may be not less than 1.1, may be not less than 1.2, may be not less than 1.3, or may be not less than 1.4 as long as the C/Si ratio is not less than 1. Moreover, the C/Si ratio may be not more than 2.0, may be not more than 1.8, or may be not more than 1.6.

The source material gas in the step of epitaxially growing the second film may be the same as or different from the source material gas used in the step of epitaxially growing the first film. The source material gas may be silane gas and propane gas, for example. The flow rate of the silane gas and the flow rate of the propane gas may be adjusted appropriately in a range of about 10 to 100 sccm to achieve a desired C/Si ratio, for example. The flow rate of the carrier gas may be about 50 slm to 200 slm, for example.

The film formation rate in the step of epitaxially growing the second film may be about not less than 5 μm/h and not more than 100 μm/h, for example. The second film has a thickness of not less than 1 μm and not more than 150 μm, for example. Moreover, the thickness of the second film may be not less than 5 μm, may be not less than 10 μm, and may be not less than 15 μm. Moreover, the thickness of the second film may be not more than 100 μm, may be not more than 75 μm, or may be not more than 50 μm.

The thickness of second film 122 may be the same as or different from the thickness of first film 121. Second film 122 may be thinner than first film 121. For example, the ratio of the thickness of second film 122 to the thickness of first film 121 may be about not less than 0.01 and not more than 0.9. Here, the ratio of the thicknesses represents a value obtained by dividing the thickness of the second film by the thickness of the first film having been through the step of reconstructing the surface. The ratio of the thicknesses may be not more than 0.8, may be not more than 0.7, may be not more than 0.6, may be not more than 0.5, may be not more than 0.4, may be not more than 0.3, may be not more than 0.2, or may be not more than 0.1. Accordingly, it is expected to increase the effect of attaining a shallow pit portion.

As described above, as shown in FIG. 1, silicon carbide film 120 including first film 121 and second film 122 is formed. In silicon carbide film 120, the first film and the second film may be incorporated completely such that they cannot be distinguished from each other.

By sequentially performing the step (S10) to the step (S23) as described above, epitaxial wafer 100 can be manufactured in which groove portion 20 is formed in the surface of silicon carbide film 120.

[Evaluation]

1. Production of Sample

Silicon carbide substrates 110 each having a diameter of 150 mm were prepared. In each of silicon carbide substrates 110, the off direction of second main surface 102 was the <11-20> direction and second main surface 102 had an off angle of 4° relative to the (0001) plane.

A sample 1 had a silicon carbide film formed using the manufacturing method according to the present disclosure. A sample 2 had a silicon carbide film formed using a manufacturing method obtained by omitting, from the manufacturing method according to the present disclosure, the step (S22) of reconstructing the surface of the first film. In each of sample 1 and sample 2, the silicon carbide film had a film thickness of 15 μm.

2. Evaluation of Shape of Groove Portion

In each sample, the shape of the groove portion formed in first main surface 101 was evaluated using a defect inspection device and an AFM. The result is shown in Table 1. The device for inspecting positions of defects as used herein was WASAVI series "SICA 6×" (objective lens: ×10) provided by Lasertec Corporation.

The AFM as used herein may be "Dimension 300" provided by Veeco, for example. Moreover, for a cantilever (probe) of the AFM, "NCHV-10V" provided by Bruker may be used, for example. For measurement conditions of the AFM, a measurement mode was set at a tapping mode, a measurement area in the tapping mode was set at a square having each side of 20 μm, and a measurement depth was set at 1.0 μm. Moreover, sampling in the tapping mode was performed under conditions that scanning speed in the measurement area was set at 5 seconds for one cycle, the number of data for each scan line was set at 512 points, and the number of the scan lines was set at 512. Moreover, displacement control for the cantilever was set at 15.50 nm.

TABLE 1

|  | Sample 1 | Sample 2 |
|---|---|---|
| Maximum Depth (Second Depth) of First Groove Portion | 3 nm | 25 nm |
| Depth (First Depth) of Second Groove Portion | Not More Than 1 nm | — |
| Width (Second Width) in One Direction | 25 μm | 1 μm |
| Width (Third Width) in Perpendicular Direction | 2 μm | 1 μm |

As shown in Table 1, in sample 1, groove portion 20 was detected in which second width 82 was twice or more as large as third width 83. Second width 82 is a width that extends in the step-flow growth direction (i.e., "one direction") along first main surface 101 and that is in the step-flow growth direction, and third width 83 is a width that is in the direction perpendicular to the step-flow growth direction.

Further, as a result of detailed inspection on the shape of groove portion 20 in sample 1, it was found that a portion exhibiting the maximum depth was included in one end portion within groove portion 20. The depth of the portion exhibiting the maximum depth was 3 nm. The depth of a portion extending from this portion to the other end portion was not more than 1 nm. That is, groove portion 20 in sample 1 included first groove portion 21 and second groove portion 22 connected to first groove portion 21, wherein first groove portion 21 was formed at one end portion of groove portion 20 in the step-flow growth direction, second groove portion 22 extends in the step-flow growth direction from first groove portion 21 to the other end portion opposite to the one end portion, and first depth 71, which was a depth from first main surface 101, was smaller than second depth 72, which was the maximum depth of the first groove portion.

On the other hand, in sample 2, a multiplicity of groove portions, i.e., pit portions 30, were detected in each of which second width 82 and third width 83 were substantially the same and second depth 72, i.e., the maximum depth was more than 10 nm. In Table 1, for convenience, the maximum depth of the groove portion in sample 2 is illustrated in the column for the maximum depth of the first groove portion.

3. Evaluation of Variation in Film Thickness of Oxide Film

By heating samples 1 and 2 in an atmosphere including oxygen, an oxide film was formed on first main surface 101 of silicon carbide film 120. Furthermore, the oxide film was observed with a transmission electron microscope to measure variation in film thickness of the oxide film. The result is shown in Table 2.

TABLE 2

|  | Sample 1 | Sample 2 |
|---|---|---|
| Film Thickness of Portion Having No Groove Portion (nm) | 52 | 52 |
| Minimum Film Thickness in the Vicinity of Groove Portion (nm) | 51 | 49 |
| Maximum Film Thickness in the vicinity of Groove Portion (nm) | 51 | 60 |
| Variation in Film Thickness (A/B) | −1/−1 | +8/−3 |

In the column "Variation in Film Thickness" in Table 2, "A/B" is illustrated to represent a difference (A) between the maximum film thickness in the vicinity of the groove portion and the film thickness of the portion having no groove portion, as well as a difference (B) between the minimum film thickness in the vicinity of the groove portion and the film thickness of the portion having no groove portion. Here, it is indicated that as A and B are both smaller values, variation in film thickness is smaller. As shown in Table 2, the variation in film thickness in sample 1 was smaller than that in sample 2 and therefore sample 1 was excellent.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: epitaxial growth device; 2: channel; 3: induction heating coil; 4: quartz tube; 5: heat insulator; 6: heating element; 7: curved portion; 8: flat portion; 100: epitaxial wafer; 101: first main surface; 102: second main surface; 103: third main surface; 110: silicon carbide substrate; 120: silicon carbide film; 121: first film; 122: second film; 20: groove portion; 21: first groove portion; 22: second groove portion; 30: pit portion; 40: threading dislocation; 71: first depth; 72: second depth; 81: first width; 82: second width; 83: third width; 84: fourth width.

The invention claimed is:

1. An epitaxial wafer comprising:
a silicon carbide film having a first main surface;
a silicon carbide substrate having a second main surface, the silicon carbide film being formed on the second main surface,
the silicon carbide film having a thickness of not less than 5 μm,
the second main surface having an off angle of not more than ±4° relative to a (0001) plane,
an off direction of the off angle being in a range of not more than ±5° relative to a <11-20> direction or in a range of not more than ±5° relative to a <01-10> direction,
a groove portion being formed in the first main surface, the groove portion extending in the off direction along the first main surface, a width of the groove portion in the off direction being twice or more as large as a width of the groove portion in a direction perpendicular to the off direction, the maximum depth of the entirety of the groove portion from the first main surface being not more than 10 nm, wherein
the groove portion includes a first groove portion and a second groove portion connected to the first groove portion,
the first groove portion is formed in one end portion of the groove portion in the off direction,
the second groove portion extends in the off direction from the first groove portion to the other end portion opposite to the one end portion, and a depth of the second groove portion from the first main surface is smaller than the maximum depth of the entirety of the first groove portion,
the first groove portion has a triangular shape in cross-section, and
the second groove portion comprises a bottom surface that is substantially parallel to the first main surface.

2. The epitaxial wafer according to claim 1, wherein the groove portion extends in the off direction of the off angle from a threading dislocation in the silicon carbide film.

3. The epitaxial wafer according to claim 1, wherein the groove portion is formed due to at least a threading screw dislocation.

4. The epitaxial wafer according to claim 1, wherein the width of the groove portion in the off direction is not less than 15 μm and not more than 50 μm.

5. The epitaxial wafer according to claim 1, wherein the first groove portion comprises a first side wall and a second side wall that form the triangular shape in cross-section, the first side wall extending from the first main surface to the second side wall, and the second side wall extending from the first side wall toward the first main surface to a depth in the silicon carbide film below the first main surface.

* * * * *